United States Patent
Ensher et al.

(10) Patent No.: US 10,355,446 B1
(45) Date of Patent: Jul. 16, 2019

(54) SYSTEM AND METHOD FOR TRAVERSING MULTIVARIATE PATHS USING MULTI-DIMENSIONAL CONTROL OF AN ELECTROMAGNETIC RADIATION SOURCE

(71) Applicant: Insight Photonic Solutions, Inc., Lafayette, CO (US)

(72) Inventors: Jason Ensher, Lafayette, CO (US); Christopher Wood, Lafayette, CO (US); Michael Minneman, Lafayette, CO (US)

(73) Assignee: INSIGHT PHOTONIC SOLUTIONS, INC., Lafayette, CO (US)

(*) Notice: Subject to any disclaimer, the term of this patent is extended or adjusted under 35 U.S.C. 154(b) by 0 days.

(21) Appl. No.: 15/803,118

(22) Filed: Nov. 3, 2017

Related U.S. Application Data

(60) Provisional application No. 62/417,471, filed on Nov. 4, 2016.

(51) Int. Cl.
| | |
|---|---|
| *H01S 5/10* | (2006.01) |
| *H01S 5/065* | (2006.01) |
| *H01S 5/0625* | (2006.01) |
| *H01S 5/12* | (2006.01) |
| *H01S 5/06* | (2006.01) |
| *H01S 5/068* | (2006.01) |

(52) U.S. Cl.
CPC .......... *H01S 5/0654* (2013.01); *H01S 5/0617* (2013.01); *H01S 5/06256* (2013.01); *H01S 5/06804* (2013.01); *H01S 5/1092* (2013.01); *H01S 5/1209* (2013.01)

(58) Field of Classification Search
CPC ..... H01S 5/0654; H01S 5/0617; H01S 5/1092
See application file for complete search history.

(56) References Cited

U.S. PATENT DOCUMENTS

| | | | | |
|---|---|---|---|---|
| 9,455,549 | B2* | 9/2016 | Minneman | ............ H01S 5/0617 |
| 2012/0320368 | A1* | 12/2012 | Jiao | .................... G01N 29/0681 |
| | | | | 356/72 |
| 2014/0341244 | A1* | 11/2014 | Minneman | ............ H01S 5/0617 |
| | | | | 372/38.02 |

* cited by examiner

*Primary Examiner* — Michael Carter
(74) *Attorney, Agent, or Firm* — Renner, Otto, Boisselle & Sklar, LLP

(57) ABSTRACT

A method for controlling an electromagnetic radiation source to produce single mode operation having an optimized side-mode suppression ratio over a set of wavelengths within a prescribed temporal profile. The electromagnetic radiation source is configured to output electromagnetic radiation at a given wavelength based upon parameters. The method includes determining a set of parameter combinations that satisfy a condition for a desired set of wavelengths and a minimum side mode suppression ratio over the range of wavelengths. The set of parameter combinations define sub-paths for nearly arbitrary transitions from one wavelength to another wavelength. Combinations of select sub-paths provide a multivariate path for transitioning over the range of wavelengths. The method also includes controlling the semiconductor laser to emit electromagnetic radiation over the range of wavelengths by traversing the multivariate path in a desired manner.

27 Claims, 15 Drawing Sheets

SYSTEM AND METHOD FOR TRAVERSING MULTIVARIATE PATHS USING MULTI-DIMENSIONAL CONTROL OF AN ELECTROMAGNETIC RADIATION SOURCE

RELATED APPLICATIONS

This application claims the benefit of Application No. 62/417,471 filed on Nov. 4, 2016, which is herein incorporated by reference in its entirety.

TECHNICAL FIELD

The present invention relates generally to a system and a method for creating and utilizing "multivariate paths" with multi-dimensional control to attain single mode operation in an electromagnetic radiation source for use in optical coherence tomography (OCT), optical frequency domain reflectometry (OFDR), spectroscopy, remote sensing, Light Detection and Ranging (LIDAR), and testing of optical components, etc.

BACKGROUND

Lasers are sometimes operated as wavelength-sweeping devices in remote sensing, LIDAR, and optical coherence tomography applications, as well as to test telecommunications components, among other applications. Discontinuities in the wavelength sweep or operation of the wavelength outside of a single mode can significantly affect the application that the laser is being used in. For example, the shape of a molecular gas absorption feature may be distorted by a discontinuity—a forward or backward jump—or operation of the wavelength outside of a single mode in the wavelength sweep of the laser. In another example, wavelength discontinuities or operation of the wavelength outside of a single mode can reduce the signal-to-noise of an OCT measurement of tissue, or a LIDAR (Laser RADAR) measurement using the Frequency Modulated Continuous Wave (FMCW) technique or more complex lidar/radar waveforms. Thus, it is usually desirable to eliminate from swept-wavelength lasers wavelength discontinuities, wavelength non-linearity, and operation of the laser outside of a single mode.

Attempts in the prior art to maintain single mode operation and to control a sweep profile for a laser are numerous, but unsatisfactory. Although it may be possible to carefully maintain single mode operation and control a sweep profile using a calibrated parameter set at an initial point in time (often referred to as pre-emphasis or predistortion), the passage of time or changes in, e.g., temperature or humidity will create discontinuities, non-linearities, and cause operation outside of a single mode. For example, mechanically-tuned external cavity lasers operate in near continuous single-mode using an external cavity mechanism coupled with a gain medium. Another example is the use of pre-emphasis to control a semiconductor laser.

In a typical single mode tunable laser, there are two key elements; a method for changing the wavelength (either internal to the cavity, or external), and another for altering the cavity length to optimize side mode suppression and to maintain single mode operation. In an analogous tunable laser, known as Littman-Metcalf configuration, there is a specific mechanical configuration which constrains the change in wavelength to happen coincident with a commensurate change in cavity length, thus maintaining single mode operation. In these mechanical systems, there is a mechanical construction which constrains the mechanical "path" which is traversed to one in which the wavelength increase is linear, and the path length difference is simultaneously changed in concert with the wavelength increase to maintain single mode operation with good SMSR. Further, in a laser that uses external feedback, the current through the gain medium is another parameter to optimize the SMSR or the wavelength tuning, making such lasers tunable via a multivariate parameter space.

Operation of the mechanical laser is maintained through accurate, tightly-toleranced components and precision alignment of the cavity, or using real-time elements such as piezoelectric transducers that adjust the cavity length in real-time. Other laser configurations use an intra-cavity element. Over time, however, the alignment of the laser degrades or the components wear, which may cause changes in the sweep profile versus time and operation outside of a single mode. As the ambient temperature, humidity, or pressure change, the alignment can degrade, which can also cause changes in the sweep profile versus time and operation outside of a single mode. Vibrations external or internal to the laser may also misalign the cavity, which again may cause changes in the sweep profile versus time and operation outside of a single mode.

Even in lasers with stable cavities, it is difficult to create wavelength sweeps (for example, using pre-emphasis) without wavelength discontinuities. Monolithically-constructed semiconductor lasers, or non-semiconductor monolithic lasers in general, are a class of single-mode laser for producing swept wavelengths. Monolithic semiconductor lasers include several sections or segments in the semiconductor, which serve, for example, as adjustable cavity mirrors, laser gain, coupled cavities, cavity phase and (optionally) external amplification. Examples are Vertical Cavity Surface Emitting Lasers (VCSELs), VCSELs with Microelectromechanical systems (MEMS) tuning structures, Vernier-tuned Distributed Bragg Reflector (VT-DBR) lasers, Vernier-tuned ring lasers, Y-branch lasers, coupled cavity lasers, discrete mode lasers, injection-locked or externally-stabilized lasers, Super-Structure Grating Distributed Bragg Reflector (SSGDBR) lasers and similar devices. Because these lasers are typically monolithic with no moving parts (excepting the MEMs devices), their cavities and associated optics are extremely stable and can operate in single-longitudinal mode with narrow linewidth and long coherence length. Tunable monolithic lasers of this class require multiple control signals to tune the wavelength, presenting a challenge to creating wavelength sweeps without wavelength discontinuities.

SUMMARY

There is a need for a system and method for determining and controlling an electromagnetic radiation source to generate rapid, highly repeatable, time-dependent, prescribed multi-wavelength patterns conformal to an optimized single mode operation, over the passage of time and without user intervention.

It is desirous to produce a multi-wavelength, time-sequenced pattern from a laser system that is conformal to an optimized single mode operation. The ratio between the main spectral mode amplitude and the most dominant side mode amplitude—i.e., the side mode suppression ratio (SMSR)—is used herein to characterize whether the laser is operating within a single mode. One such multi-wavelength pattern is known as a wavelength sweep. A wavelength sweep, as used in this disclosure, refers to a continuous (or step-wise continuous) movement over time from one wavelength to another, in a prescribed (and often preferably in a linear, monotonic) fashion. A wavelength sweep can represent the entire desired waveform, or it can represent one or more elements of a more complex waveform.

As would be understood by one of ordinary skill in the art, the optical frequency and optical wavelength are inversely proportional to each other and a wavelength sweep or movement in wavelength is also an optical frequency sweep or movement in optical frequency.

Another multi-wavelength pattern is referred to as wavelength hopping. Wavelength hopping, as used in this disclosure, is similar to wavelength stepping (as described below) but with much shorter periods of time for the continuous operation, or dwells, at any given wavelength. Hopping refers to a sharp transition (short time interval) between two distinct wavelengths. A sequential hopping pattern with small wavelength differences represents one method for obtaining a sweep, for instance. For example, FIGS. 5-9 show examples of sequential hopping patterns and are described in more detail below. Or, it can be more complex, such as randomly choosing between the wavelengths in the set, possibly until each wavelength in the set has been addressed, which results in a waveform dramatically different from a linear sweep. For example, FIGS. 10-15 show examples of such patterns and are described in more detail below. Wavelength hopping may incorporate random intervals of time dwelling at any given wavelength before moving to the next wavelength, rather than a consistent dwell at each given wavelength. Wavelength hopping patterns may be combined with wavelength sweeping and stepping patterns, in near-arbitrary and countless permutations. Traditionally, wavelength hopping with a laser requires a host of expensive and external hardware and electro-optical components, rather than accomplishing the control using the laser itself. A prescribed wavelength hop, or wavelength step, is a transition from one wavelength to another, at a pre-determined time, and can be viewed as a discontinuity in the wavelength pattern, but in the context of a prescribed waveform is a desirable (as opposed to undesirable) discontinuity.

Yet another multi-wavelength pattern for a laser is known as wavelength stepping. Wavelength stepping, as used in this disclosure, refers to continuous operation at one wavelength, followed by continuous operation at another wavelength, possibly followed by continuous operation at a third wavelength, etc. FIGS. 16-18 are examples of wavelength stepping patterns. Such stepping can occur in a simple sequential pattern, transitioning from one wavelength to the next within a set of wavelengths. Or, it can be more complex, such as randomly choosing between the wavelengths in the set. Wavelength stepping may incorporate random intervals of time dwelling at any given wavelength before moving to the next wavelength, rather than a consistent dwell at any given wavelength. Wavelength stepping patterns may be combined with wavelength sweeping patterns, in near-arbitrary and countless permutations. Traditionally, wavelength stepping with a laser requires a host of expensive and external hardware and electro-optical components, rather than accomplishing the control using the laser itself.

In FIGS. 10-15, patterns (waveforms) are shown having larger, rapid changes in wavelength, followed by sequences of small wavelength steps, often of equal size. In a digitally controlled laser, the programmed change in the wavelength may always be "stepped", though in reality the laser may express this in an analog way. In FIGS. 16-18, the waveforms are of a stepped pattern. The laser operates continuously at one wavelength for a defined period of time (a first step), the system then changes the laser's wavelength quickly relative to the period of the step to a new wavelength (either higher or lower) and the laser operates there for a new period of time (either the same, shorter or longer) that defines a second step, followed by another short duration change to the wavelength for a third step for a third time interval and so on.

Yet another sweep pattern that can be realized with this method is wavelength modulation. FIGS. 19-23 show examples of wavelength modulation sweep patterns. Here, the prescribed time sequence of wavelength steps is chosen so that, for example, the resulting wavelength pattern is sinusoidal in nature. Such wavelength modulation can be combined with other wavelength patterns to form a more complex wavelength sweep. In addition to wavelength modulation, amplitude modulation can also be implemented in conjunction with any of the above sweep patterns. FIG. 24 shows an example of amplitude modulation.

Finally, the wavelength sweep pattern can deviate substantially from a linear trend, and can instead be quite nonlinear in nature. An example of a non-linear pattern is shown in FIG. 25. So long as the optical system can provide the correct information for generation of this curve, then the controller can repeatedly create this function with high accuracy.

A laser may also undergo a wavelength hop at a non-prescribed wavelength, and at a generally indeterminate time, to a generally indeterminate (but nearby) wavelength. This undesirable form of a wavelength hop is known in the industry as a 'mode hop'. The interaction of multiple input parameters determines the output wavelength of a laser. Preventing such undesirable mode hops in the laser output thus requires understanding how to adjust the multiple parameters across the wavelength set, or wavelength range. A further complication to creating and maintaining a wavelength pattern is that time and temperature affect tuning in meaningful amounts. This means that for precise tuning accuracy, the Parameter Sweep Paths (PSPs) must also change over time. It is an aspect of this invention to adaptively measure and precisely control these PSPs as they change over time due to any factors, and without user intervention.

As described above, multiple parameters interact to control a laser output. Describing the relationship between the parameters is difficult due to the number of parameters, the interactions between the parameters, the dependence of the parameters on environmental factors, and the effect of the components' age on laser output.

The output wavelength is determined based on the parameters and the external factors mentioned above, through the expression:

$$\lambda(c, t) = \sum_{i=0}^{m} \sum_{j=0}^{k} F(c_i, t_j)$$

where $\lambda$ is the wavelength at a particular time $t_j$ and where $c_i$ are the m parameters, which interact to influence the desired output wavelength. The parameters $c_i$ might include, e.g., for a semiconductor monolithic tunable laser source (SMTLS), controllable factors such as front mirror current, back mirror current, phase current, gain, semiconductor optical amplifier current, and external factors such as feedback wavelength, temperature and humidity.

As described above, the degree to which a laser operates in a single longitudinal mode of the laser cavity is often measured by the SMSR of the laser. The SMSR is also governed by the multiple control parameters of the laser, as well as the external factors mentioned above, through the expression:

$$SMSR(c, t) = \sum_{i=0}^{m} \sum_{j=0}^{k} G(c_i, t_j)$$

Attempts to control a laser by developing an overarching model that relates the control parameters to the laser output and holding the external factors constant (so called 'pre-emphasis') has not been successful in achieving the desired results, because of three factors. First, external factors cannot be held sufficiently constant. Second, because a laser is a non-linear system, the control parameters $c_i$ may have a tremendously complex interaction in determining the wavelength, SMSR, power or other performance metric of the laser. Third, the time-dependency necessary to control the laser to achieve specific outcomes is very complicated, and changes over time as the external factors (temperature, humidity, vibration) change and as the laser or its control systems age.

Other methods for obtaining longer-term control over a wavelength sweep, at least for a linear sweep, have been disclosed previously. Those methods involve an opto-electronic closed-loop approach (optical phased locked loops, OPLLs) and are not the subject of this invention. Examples of such approaches are described in U.S. Pat. Nos. 5,751,747; 6,034,976; 8,175,126; 7,995,630; and 8,913,636. Such methods produce good linearity, but suffer from speed limitations, require additional hardware, have complex closed loop operation, and are extremely difficult to adapt to non-linear types of waveforms such as frequency stepping and hopping. A limitation of the prior art methods is that when the relationship between laser control parameter and laser performance becomes sufficiently non-linear, the closed loop approach breaks down. Another limitation of prior art methods of closed loop control is that as the laser's response to the control parameter changes over time (due to aging of the laser, aging of the control electronics or mechanics, or due to changes in the environment of the laser) the closed-loop approach—which relies on a prior knowledge and stability of the control response relationship—breaks down.

In one embodiment, it is an aspect of this invention that control over the laser's PSPs does not require analog closed loop operation via a phase locked loop. It is another aspect of the present invention that control over the laser's PSPs may be not limited by feedback time of the control circuit, the measurement electronics, or the loop time. This makes certain embodiments of the present invention especially applicable to sweeps with wavelength versus time profiles where the waveform time is very short (less than about 0.5-10 microseconds) and the changes in wavelength during the waveform may happen very quickly (such as within nanoseconds), as may be encountered in the fields of use listed above.

Rather than trying to determine the functions $F(c_i,t_j)$ or $G(c_i,t_j)$, which can be very difficult or potentially intractable, it is only necessary to determine the limited set of potential solutions that satisfy the conditions of a desired set of wavelengths and minimum SMSR over a range of wavelengths. If the parameters are viewed as a multivariate space with each point in the space corresponding to a parameter combination causing a laser output having a corresponding wavelength and SMSR, there are only certain "multivariate paths" through the multivariate space that will maintain the single mode operation with optimal (e.g., maximal) SMSR. A multivariate path can be determined by identifying sub-paths that satisfy the conditions of a desired set of wavelengths and minimum SMSR over a subrange of the range of wavelengths. The sub-paths can be combined and traversed along in a prescribed manner (for example, in linear increasing wavelength or linear increasing optical frequency) as a multivariate path through the multivariate space defined by the parameters (=a wavelength sweep). Alternatively, the sub-paths can be traversed using a combination of wavelength sweeping (e.g., where the sweeping may be performed continuous or through a series of discrete steps), wavelength sub-sweeps (e.g., where the sweeping may be performed continuous or through a series of discrete steps), wavelength stepping, and wavelength hopping. Further, these combinations can involve sequential or adjacent wavelength transitions, or they may involve random selections of time-sequenced wavelengths within the range. Further, the instantaneous wavelengths between steps or hops can be either step wise (e.g., visually representing a staircase) or a continuous smooth monotonic transition from point to point.

The present invention provides a system and method for controlling a monolithic laser source to produce a single mode operation having an optimized side-mode suppression ratio over a set of wavelengths by adaptively determining a multivariate path for transitioning from one wavelength to another. In this way, and without user intervention, the invention may periodically determine and update an appropriate set of sub-paths (PSPs) for transitioning between wavelengths that satisfy a condition for a desired set of wavelengths and a minimum side mode suppression ratio rather than attempting to (e.g., a-priori) determine the relationship between the inputs, output wavelength, and side mode suppression ratio over all possible conditions.

According to one aspect, a method is presented for controlling an electromagnetic radiation source to produce a single mode operation having an optimized side-mode suppression ratio over a set of wavelengths within a prescribed temporal profile. The electromagnetic radiation source is configured to output electromagnetic radiation at a given wavelength based upon parameters. The method includes determining a set of parameter combinations that satisfy a condition for a desired set of wavelengths and a minimum side mode suppression ratio over the range of wavelengths. The set of parameter combinations define sub-paths for transitioning from one wavelength to another wavelength. Combinations of select sub-paths provide a multivariate path (PSP) for transitioning over the range of wavelengths. The method also includes adaptively controlling the laser, over time and other conditions, to emit electromagnetic radiation over the range of wavelengths by traversing the multivariate path in a desired manner. The desired manner is prescribed and time-sequenced, may include sweeps, hops, or steps, may be repeating in time, and the laser outputs the electromagnetic radiation in a single mode having the optimized side-mode suppression ratio over the range of wavelengths.

A number of features are described herein with respect to embodiments of the invention; it will be appreciated that features described with respect to a given embodiment also may be employed in connection with other embodiments.

The invention includes the features described herein, including the description, the annexed drawings, and, if appended, the claims, which set forth in detail certain illustrative embodiments. These embodiments are indicative, however, of but a few of the various ways in which the principles of the invention may be employed.

DETAILED DESCRIPTION

The present invention provides a method for adaptively controlling an electromagnetic radiation source to produce a single mode operation having an optimized side-mode suppression ratio (SMSR) over a set of wavelengths within a prescribed temporal profile. The electromagnetic radiation source is configured to output electromagnetic radiation at a given wavelength based upon parameters. The method may include periodically determining a set of parameter combinations without user intervention that satisfy a condition for a desired set of wavelengths and a minimum side mode suppression ratio over the range of wavelengths. The set of parameter combinations define sub-paths for transitioning from one wavelength to another wavelength. Combinations of select sub-paths provide a multivariate path for transitioning over the range of wavelengths. The method also includes controlling the laser to emit electromagnetic radiation over the range of wavelengths by traversing the multivariate path in a desired manner. The desired manner is prescribed and time-sequenced, may include sweeps, hops, or steps, may be repeating in time, and the laser outputs the electromagnetic radiation in a single mode having the optimized side-mode suppression ratio over the range of wavelengths.

Figure 1:
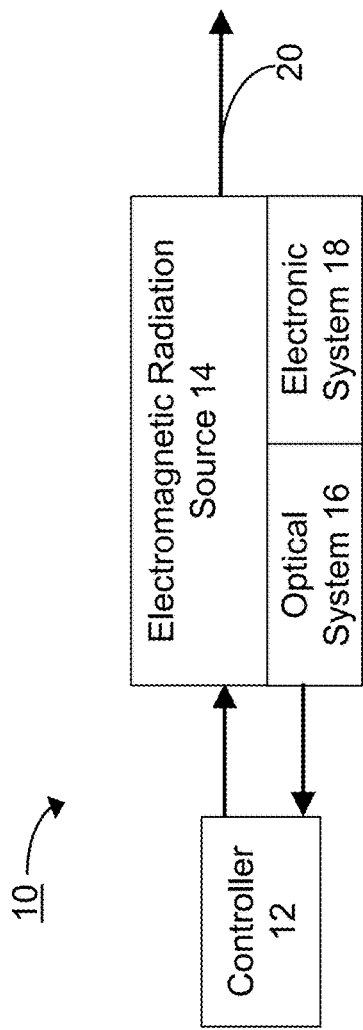
FIG. 1 is a block diagram of an exemplary system including a controller and an electromagnetic radiation source.

An exemplary system 10 in accordance with aspects of the present disclosure is illustrated in FIG. 1. The system 10 includes a controller 12 and an electromagnetic radiation source 14 (e.g., a semiconductor laser). The controller 12 and electromagnetic radiation source 14 are shown as separate devices, but may be part of the same device. The controller 12 generates control signals including parameters that are supplied to the electromagnetic radiation source 14. The electromagnetic radiation source 14 generates electromagnetic radiation 20 in response to the parameters. For example, the parameters may include front mirror current, back mirror current, phase current, gain, semiconductor optical amplifier current, specific subsystem temperatures, indices of refraction, pressures, positions of cavity mirrors, external optical feedback, or any combination thereof. In another example, the parameters may include position of a movable mirror, gain current, phase current, fine cavity length adjust mechanism, or any combination thereof. The parameters affecting the generation of electromagnetic radiation 20 also include environmental factors such as temperature, humidity, etc. The electromagnetic radiation source 14 may be a semiconductor laser, e.g., a monolithic semiconductor laser, DFB laser, DBR laser, a Vernier-tuned distributed Bragg reflector (VT-DBR) laser, MEMS-tunable semiconductor laser, or any other suitable type. For example, the laser may be one or more of a Vertical Cavity Surface Emitting Laser (VCSEL), VCSEL with Microelectromechanical systems (MEMS) tuning structures, Vernier-tuned Distributed Bragg Reflector (VT-DBR) laser, Vernier-tuned ring laser, Y-branch laser, coupled cavity laser, discrete mode laser, injection-locked or externally-stabilized laser, Super-Structure Grating Distributed Bragg Reflector (SSGDBR) laser, and/or similar devices.

As will be understood by one of ordinary skill in the art, the controller 12 may have various implementations. For example, the controller (also referred to as circuitry) may include a processor or any other suitable device, such as a programmable circuit, integrated circuit, memory and I/O circuits, an application specific integrated circuit, microcontroller, complex programmable logic device, other programmable circuits, or the like. The controller may also include a non-transitory computer readable medium, such as random access memory (RAM), a read-only memory (ROM), an erasable programmable read-only memory (EPROM or Flash memory), or any other suitable medium. Instructions for performing the method described below may be stored in the non-transitory computer readable medium and executed by the processor.

The controller 12 may, in additional to controlling the electromagnetic radiation source 14, function to determine a multivariate path for driving the electromagnetic radiation source 14 to output electromagnetic radiation 20 transitioning over a range of wavelengths. The controller controls the electromagnetic radiation source 14 to emit electromagnetic radiation 20 over the range of wavelengths by traversing the multivariate path. The controller 12 may also control one or more output devices to provide information related to the system and/or method to an associated user and/or cause information to be output to another device for additional processing or display, for example.

The system 10 may also include an optical system 16 and an electronic system 18. The optical system 16 may receive a portion of the outputted electromagnetic radiation 20 and generate signals or data in response to the wavelength, SMSR, optical power, or other properties of the electromagnetic radiation 20. The optical system 16 may include an interferometer. The optical system 16 may receive electromagnetic radiation output by the electromagnetic radiation source 14 even when the electromagnetic radiation is prevented from exiting the electromagnetic radiation source 14 by a shutter (e.g., a structure configured to prevent electromagnetic radiation from exiting the electromagnetic radiation source 14).

The optical system 16 may be coupled to the controller and the controller may analyze the data or signals for adaptively determining the wavelength and SMSR of the output electromagnetic radiation 20 in response to the parameters supplied to the electromagnetic radiation source 14. The electronic system 18 may measure the parameters at the electromagnetic radiation source 14. For example, the electronic system 18 may measure the certain electrical signals which are secondarily correlated to pertinent optical characteristics of the output of the electromagnetic radiation source 14. The electronic system 18 may be coupled to the controller 12 and the controller 12 may analyze the parameters as received by the electromagnetic radiation source 14 to determine the performance factors at the electromagnetic radiation source 14 and to detect defects in the current multivariate path being operated, and to periodically update the multivariate path.

Figure 2:
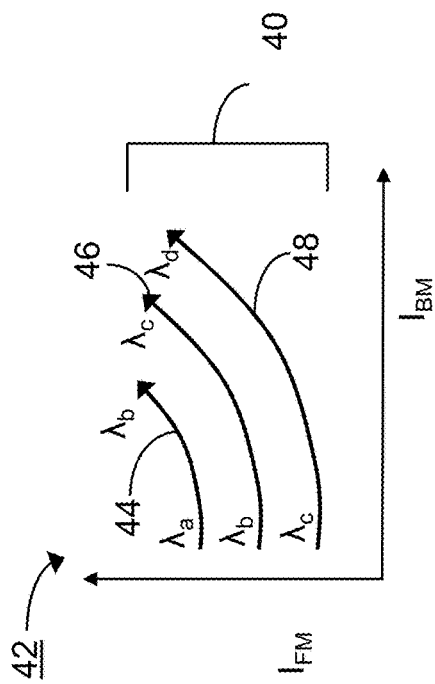
FIG. 2 is an exemplary graph of a multivariate path plotted in a multivariate space.

An exemplary multivariate path 40 for an exemplary VT-DBR semiconductor laser is shown in FIG. 2. The multivariate path 40 is shown in the multivariate space 42 defined by the parameters front mirror current and back mirror current. In this multivariate space 42, the other parameters affecting the wavelength and SMSR of the electromagnetic radiation 20 (e.g., phase current, gain, semiconductor optical amplifier current, temperature, humidity, vibration, etc.) are held constant. As will be understood by one of ordinary skill in the art, only a two dimensional multivariate space 42 is shown, because of the difficulty in visualizing higher dimensional spaces on paper. Other multivariate spaces including more dimensions—representing other parameters—are contemplated. The multivariate path 40 of FIG. 2 produces a continuous range of wavelengths from $\lambda_A$ to $\lambda_D$. The multivariate path is composed of three discontinuous selected sub-paths 44, 46, 48. All three selected sub-paths 44, 46, 48 include parameter combinations that satisfy a condition for a desired set of wavelengths and a minimum side mode suppression ratio. The first selected sub-path 44 is defined by parameter combinations resulting in the output of electromagnetic radiation 20 in the wavelength range from $\lambda_A$ to $\lambda_B$. The second selected sub-path 46 is defined by parameter combinations resulting in the output of electromagnetic radiation 20 in the wavelength range from $\lambda_B$ to $\lambda_C$. The third selected sub-path 48 is defined by parameter combinations resulting in the output of electromagnetic radiation 20 in the wavelength range from $\lambda_C$ to $\Lambda_D$. The three sub-paths 44, 46, 48 are combined into the multivariate path 40 defined by parameter combinations resulting in the output of electromagnetic radiation 20 in the wavelength range from $\lambda_A$ to $\lambda_D$. Each of the sub-paths 44, 46, 48 are a small subset of all of the combinations of these two parameters which could meet the conditions of the desired set of wavelengths, but only a subset describe a progression which satisfies the multiple performance criteria of the laser (i.e., increasing wavelength and minimum SMSR). Note that the actual number of these multiple conditions is not limited to two.

As will be understood by one of ordinary skill in the art, the multivariate path is not limited to two controllable parameters. Rather, the multivariate path may comprise a single controlled parameter (e.g., a current or voltage) and one or more uncontrolled parameters (e.g., humidity and/or temperature).

Figure 3:
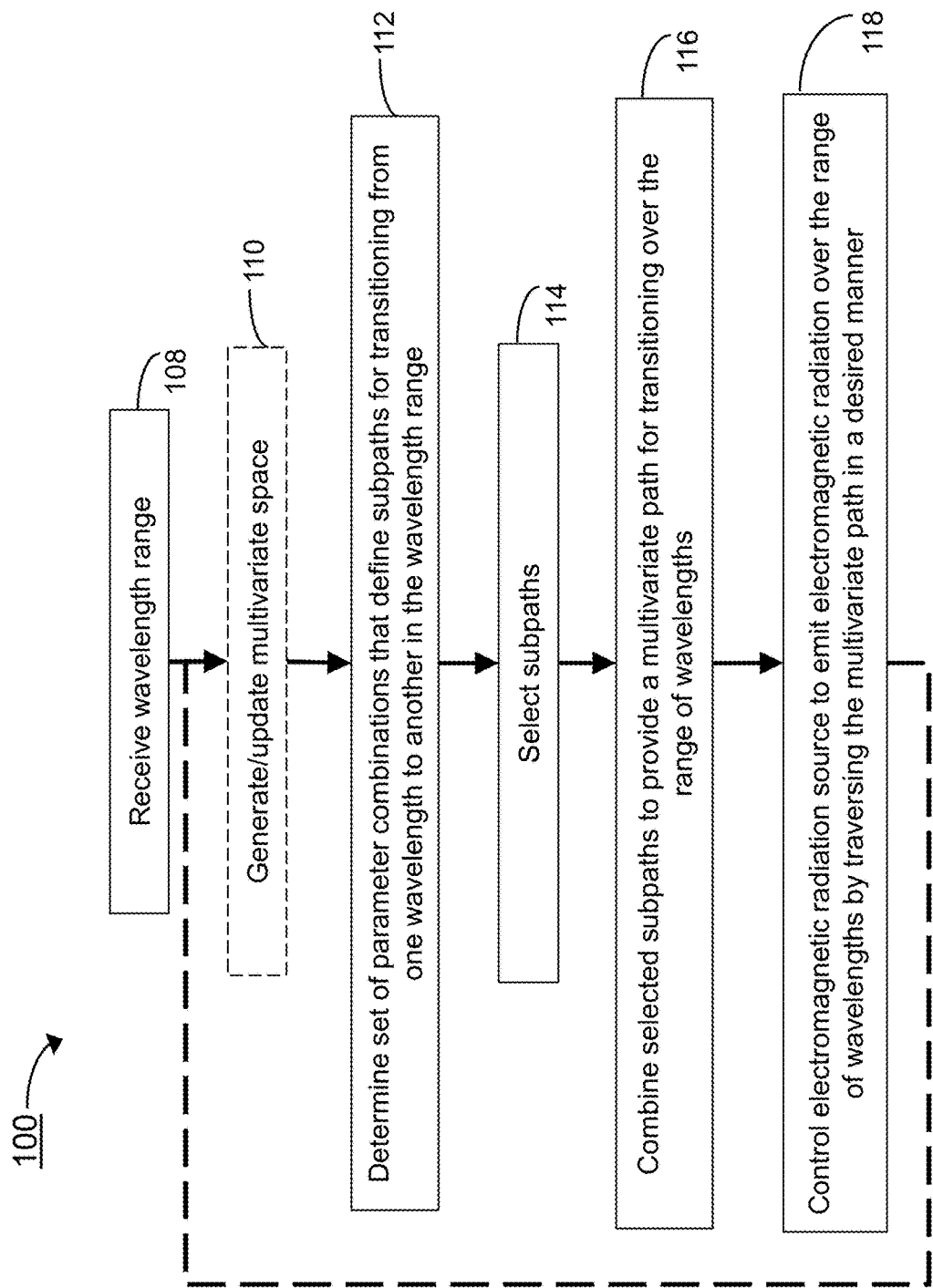
FIGS. 3 and 4 are block diagrams illustrating a method in accordance with aspects of the present disclosure.

With reference to FIG. 3, a block diagram is shown for a method to sweep an electromagnetic radiation source 14 to produce a single mode operation having an optimized SMSR over a set of wavelengths within a prescribed temporal profile. In process block 108, a range of wavelengths is supplied to the system 10. In order to define sub-paths for transitioning from one wavelength to another, the wavelength and SMSR of the electromagnetic radiation 20 output for a given set of parameters by the electromagnetic radiation source 14 must be known. For this reason, a multivariate space 42 may optionally be generated in process block 110.

As described above, the wavelength and SMSR of the electromagnetic radiation 20 output by the electromagnetic radiation source 14 for a given set of parameters may change with time due to changes in humidity, temperature, equipment misalignment, component damage, component misalignment, etc. For this reason, a multivariate space 42 may be generated if a multivariate space 42 has not been recently generated. The multivariate space 42 may be generated just prior to the determination of a multivariate path 40 and the generation of a sweep with the electromagnetic radiation source 14. A multivariate space 42 may also be generated if the wavelength and SMSR have not been measured for parameter combinations in the multivariate space 42.

A multivariate space 42 may be generated by supplying a parameter combination corresponding to each point in the multivariate space 42 and measuring the output wavelength and SMSR of the electromagnetic radiation source 14. A multivariate space 42 may also be generated by measuring (e.g., with the optical system 16) the output wavelength and SMSR of the electromagnetic radiation source 14 for a subset of the parameter combinations in the multivariate space 42. The measured wavelength and the measured side mode suppression ratio may then be incorporated into the multivariate space at the point in the multivariate space designated by the parameter combination.

The parameter combinations included in the multivariate space may be set by default or user defined. Also, when the electromagnetic radiation source is being controlled to emit electromagnetic radiation by traversing the multivariate path in the desired manner, the emitted electromagnetic radiation may be measured by the optical system 16 and used to update the multivariate space. That is, when a given parameter combination is already incorporated into the multivariate space, the multivariate space may be updated to include the measured wavelength and the measured side-mode suppression ratio.

The generation of the multivariate space may be performed according to different criteria. For example, the generation of the multivariate space may performed when the wavelength and the side-mode suppression ratio for a particular supplied parameter combination has not been measured for a given duration of time (e.g., one hour, 24 hours, or one month) or when a user requests generation of the multivariate space. Alternatively or additionally, the generation of the multivariate space may be performed when an ambient temperature at which the wavelength and the side-mode suppression ratio for a given parameter combinations was measured changes by at least a predetermined amount (e.g., five degrees Celsius or ten degrees Celsius). Alternatively or additionally, the multivariate space may be generated when a specified set of parameter combinations does not satisfy the condition for the desired set of wavelengths within a desired tolerance (e.g., within 1%, 3%, 5%, or 10%). As an example, the multivariate space may be generated when the measured side-mode suppression ratio and/or the time sequence of wavelengths emitted by the electromagnetic radiation source deviates by more than the desired tolerance.

Generating of the multivariate space may be performed by measuring with the optical system 16 the emitted electromagnetic radiation over the range of wavelengths when traversing the multivariate path in the desired manner. Alternatively or additionally, generating of the multivariate space may be performed during a time duration when the electromagnetic radiation source is not outputting electromagnetic radiation. For example, a shutter of the electromagnetic radiation source 14 may be closed such that electromagnetic radiation is not emitted externally by the electromagnetic radiation source 14. While shuttered, parameter combinations may be supplied to the electromagnetic radiation source 14 and the output of the electromagnetic radiation source 14 may be measured with the optical system 16. That is, even though the electromagnetic radiation is not being emitted to the external environment by the electromagnetic radiation source 14, the generated electromagnetic radiation may be received by the optical system 16. For example, the wavelength and the side-mode suppression ratio of the electromagnetic radiation generated by the electromagnetic radiation source 14 may be measured by the optical system 16.

As another example, the multivariate space 42 of FIG. 2 represents the two variable parameters front mirror current and back mirror current. In order to generate the multivariate space 42, other parameters are held constant while a parameter combination (including a value for front mirror current and back mirror current) is provided to the electromagnetic radiation source 14 for each point of the multivariate space. The output wavelength and SMSR corresponding to each parameter combination is recorded. The multivariate space 42 may consist of a continuous range of parameter combinations, discontinuous ranges of parameter combinations, discrete parameter combinations spread across the multivariate space 42, or any other suitable group of parameter combinations.

In process block 112, a set of parameter combinations are determined that satisfy (1) a condition for a desired set of wavelengths in the range of wavelengths and (2) a minimum SMSR over the range of wavelengths. The set of parameter combinations define sub-paths for transitioning from one wavelength to another in the wavelength range. For example, a parameter combination—i.e., a point—in the multivariate space 42 is determined that results in the output of electromagnetic radiation 20 having a wavelength A and a minimum SMSR over the range of wavelengths. A set of such parameter combinations can be determined that define a sub-path for transitioning from one wavelength to another wavelength in the range of wavelengths. In FIG. 3, three sets of parameter combinations are shown defining three sub-paths 44, 46, 48. Each sub-path defines a path for transitioning between a range of wavelengths. As will be understood by one of ordinary skill in the art, sub-paths may be determined in any suitable manner. For example, sub-paths may be detected using a heuristic algorithm, nearest neighbor algorithm, minimum spanning tree algorithm, dynamic programming, Primm's algorithm, etc.

In process block 114, sub-paths are selected from the available sub-paths. Sub-paths may be selected using any suitable criteria. For example, sub-paths may be selected based on the average SMSR of the sub-path, maximum SMSR of the path (e.g., only sub-paths with a maximum SMSR below a threshold are selected), or a combination thereof. Sub-paths may also be excluded from selection if the sub-path corresponds to a range of wavelengths smaller than a range threshold. In process block 116, the selected sub-paths are combined to provide a multivariate path for transitioning over the range of wavelengths. Although not easily represented on paper, a very small subset of all combinations of the parameters form distinct, discontinuous, paths through the multivariate space. Following these paths (e.g., combining the sub-paths into a multivariate path), it is possible to progress through the desired wavelengths in a desired fashion while satisfying the other conditions. The selected sub-paths may be combined by combining the parameter combinations in the select sub-paths. If the selected sub-paths overlap in wavelength range, the overlapping sub-paths may be shortened to remove the overlap. The sub-paths may be shortened by keeping only the overlapping parameter combinations with the highest SMSR.

Finally, in process block 118, the electromagnetic radiation source 14 is adaptively controlled by the controller 12, optical system 16, and electronic system 18 to emit electromagnetic radiation 20 over the range of wavelengths by traversing the multivariate path in a desired manner. The desired manner may for example be a linear sweep, and may therefore be linear increasing wavelength or optical frequency output in a single mode having the optimized side-mode suppression ratio over the range of wavelengths.

Following process block 118, the method may return to optional process block 110 or process block 112. This process flow provides a closed loop around the generation of the sweep and allows for the use of multiple parameters non-linear and even non-monotonic relationships between the control parameters and the optical frequency and SMSR of the emitted electromagnetic radiation. In this way, the method is not limited to a single control parameter combination with a clear and static functional relationship to the behavior of the electromagnetic radiation source 14 or the emitted electromagnetic radiation. By not limiting the method to a static control parameter combination, the method accounts for the effects of external temperature, strain, pressure, humidity, etc., and by the aging of the device, or of the control electronics that changes the relationship between the control parameter combinations and the properties of the emitted electromagnetic radiation.

Figure 4:
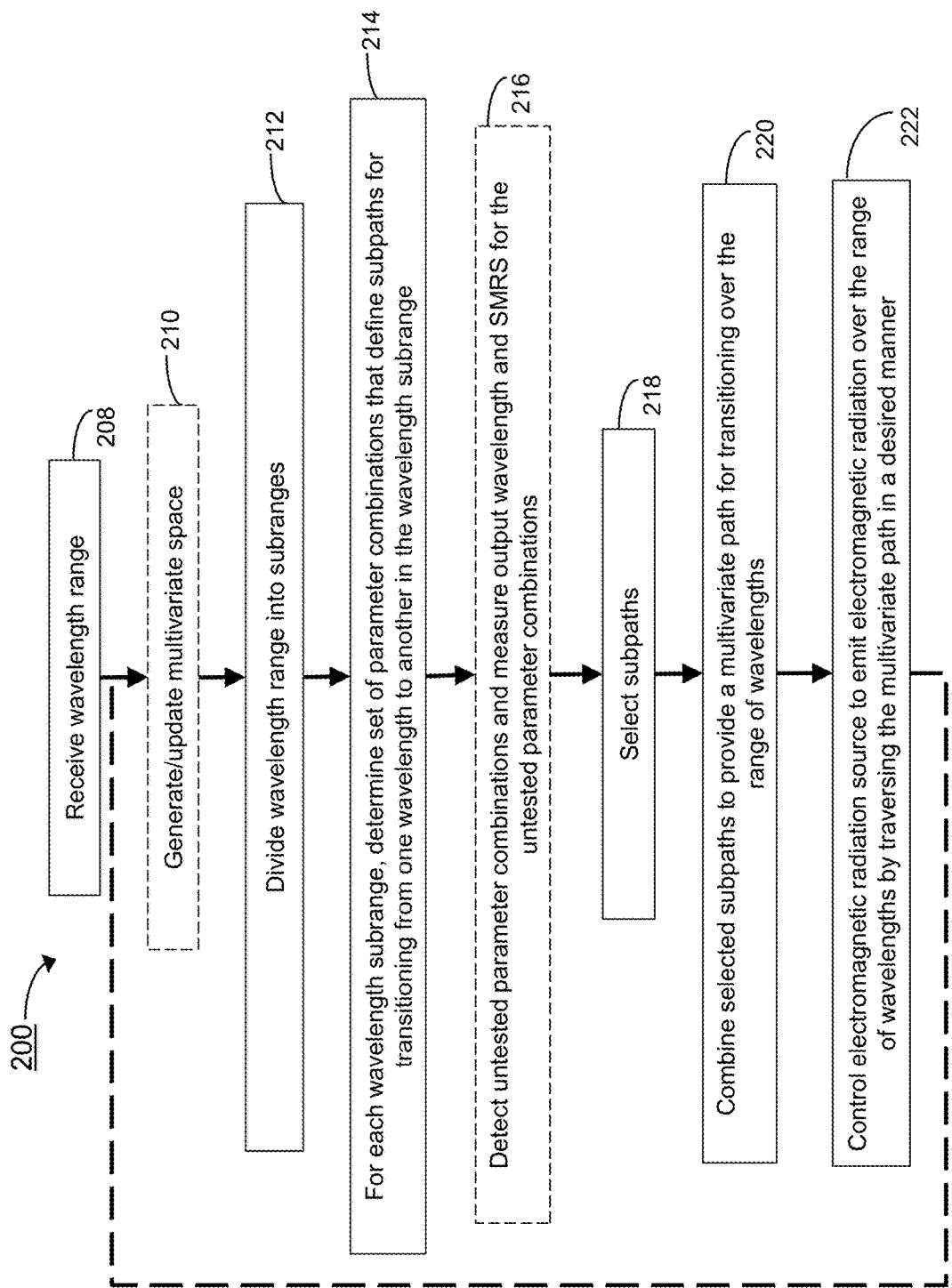

Another example of a method for controlling an electromagnetic radiation source 14 to produce a single mode operation having an optimized SMSR over a set of wavelengths within a prescribed temporal profile is shown in FIG. 4. In process block 208, a range of wavelengths is supplied to the system. In process block 210, as described previously, a multivariate space may optionally be generated. In process block 212, the range of wavelengths is divided into subranges. For example, if the wavelength range is from 1350 nm to 1550 nm, the wavelength range may be divided into subranges, e.g., 1350-1400 nm, 1401-1450 nm, 1451-1500 nm, and 1501-1550 nm. As will be understood by one of ordinary skill in the art, the above subranges are only exemplary and a wavelength range can be divided into larger or smaller wavelength ranges. Subranges may also be created that are not of equal size and that overlap. For example, the wavelength range of 1350 nm to 1550 nm may be divided into subranges including 1350-1375 nm, 1350-1400 nm, 1350-1450 nm, 1375-1400 nm, 1375-1550 nm, 1400-1450 nm, 1400-1550 nm, 1425-1440 nm, 1450-1500 nm, 1450-1525 nm, 1500-1525 nm, and 1500-1550 nm.

In process block 214, a set of parameter combinations are determined for each subrange of wavelengths that satisfy (1) a condition for a desired set of wavelengths in the subrange of wavelengths and (2) a minimum SMSR over the subrange of wavelengths. The set of parameter combinations define sub-paths for transitioning from one wavelength to another wavelength within the subrange of wavelengths. Sub-paths for transitioning within a subrange of wavelengths may be determined in the same manner as described previously.

In process block 216, additional untested parameter combinations may optionally be identified and added to the multivariate space 42. For example, a sub-path may be identified that extends into a region of multivariate space that does not contain data regarding output wavelength and SMSR. As another example, a range of parameter values may be identified as possibly connecting two unconnected sub-paths. If untested parameter combinations are identified, the previously untested parameter combination may be input to the electromagnetic radiation source 14, the output wavelength and SMSR measured, and this data added to the multivariate space 42.

In process block 218, sub-paths are selected from the sub-paths as described previously. In process block 220, the selected sub-paths are combined to provide a multivariate path for transitioning over the range of wavelengths. In process block 222, the electromagnetic radiation source 14 is controlled to emit electromagnetic radiation 20 over the range of wavelengths by traversing the multivariate path in a desired manner. The desired manner may be any form of wavelength sweep, as defined and described in additional detail below.

Following process block 222, the method may return to optional process block 210 or process block 212. As described above regarding method 100, this process flow provides a closed loop around the generation of the sweep and allows for the use of multiple parameters non-linear and even non-monotonic relationships between the control parameters and the optical frequency and SMSR of the emitted electromagnetic radiation.

Figure 5:
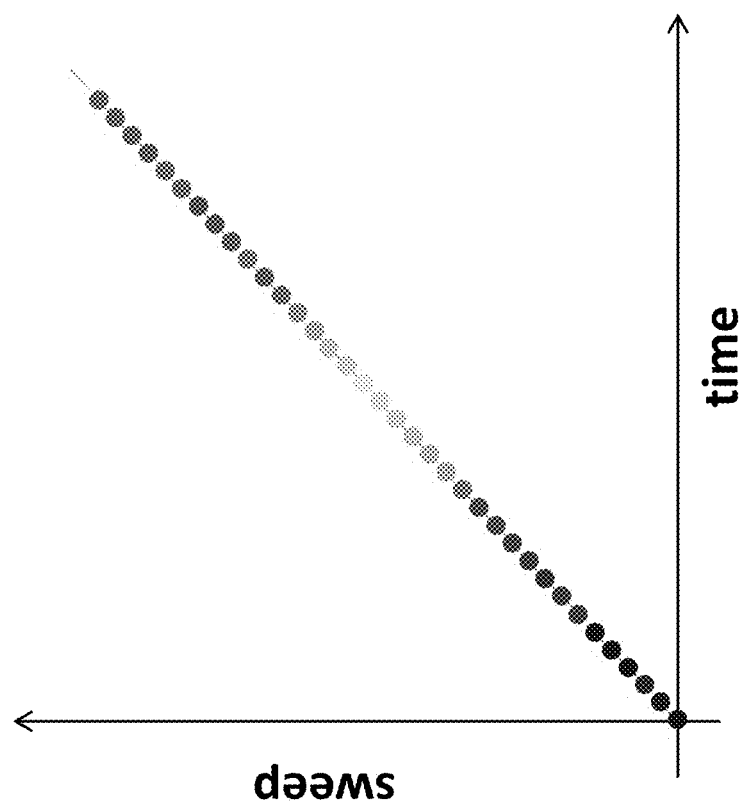
FIG. 5 is a plot of an exemplary standard linear wavelength (frequency) sweep, using evenly spaced intervals between wavelength (frequency) steps.
Figure 6:
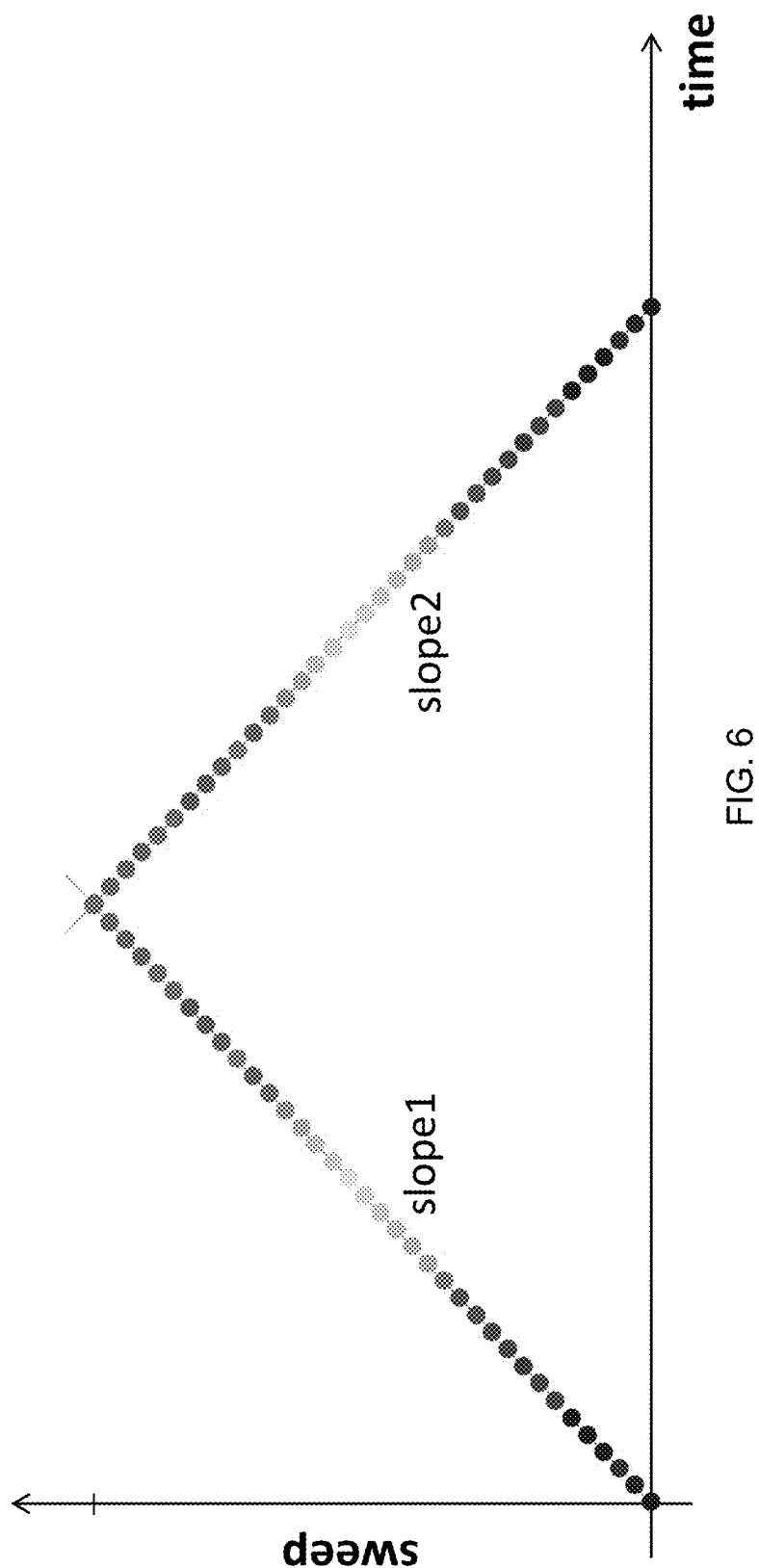
FIG. 6 is a plot of an exemplary modified linear wavelength (frequency) sweep having two different slopes.

FIG. 5 is a plot of an exemplary standard linear wavelength (frequency) sweep, using evenly spaced intervals between wavelength (frequency) steps. FIG. 6 is a plot of an exemplary standard linear wavelength (frequency) sweep having two equal and opposite linear slopes. The sweeps shown in FIG. 5 or FIG. 6 may be used in frequency-modulated continuous-wave (FMCW) LIDAR. The two equal and opposite linear slopes enable extraction of parameters (such as velocity) from the resulting data. As will be understood by one of ordinary skill in the art, the angle of the two slopes may not be equal.

Figure 7:
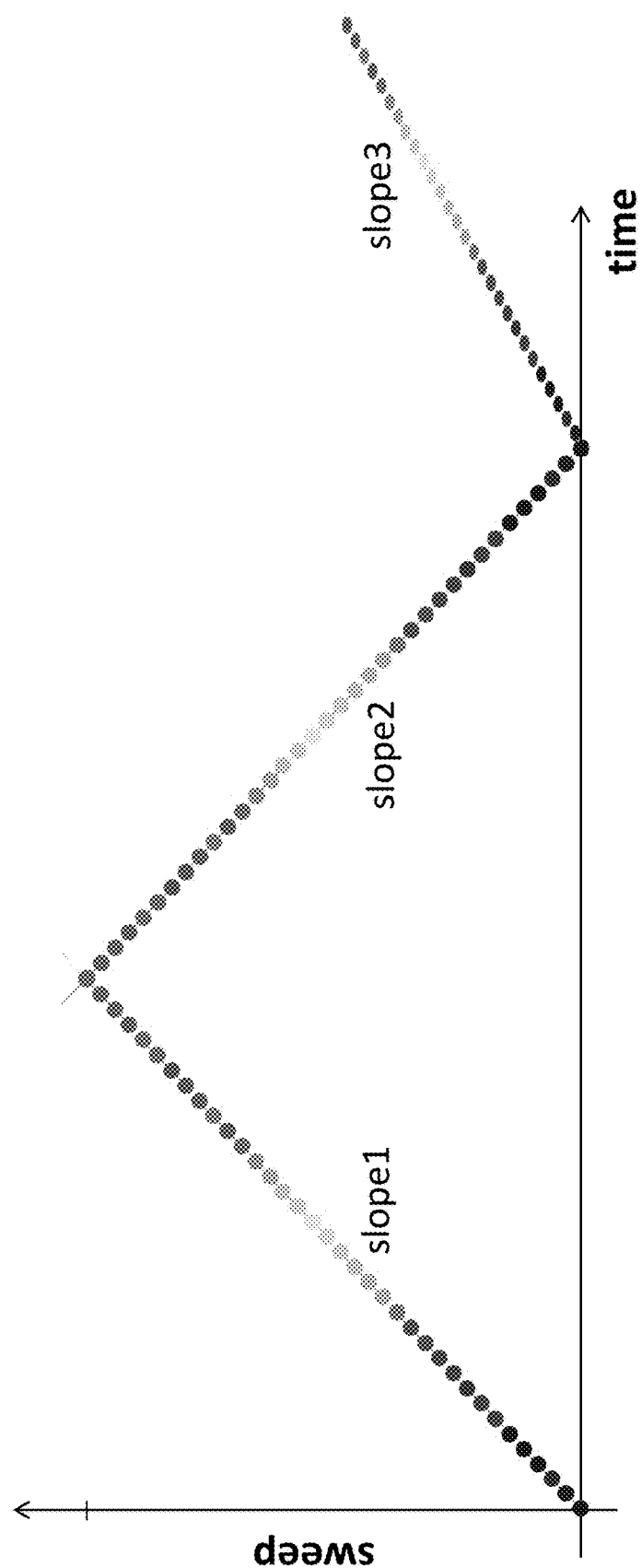
FIG. 7 is a plot showing an alternative exemplary modified linear waveform having three different slopes.

FIG. 7 is a plot showing an exemplary enhanced waveform using three different slopes. The sweep shown in FIG. 7 enables multi-target discrimination in FMCW LIDAR. While three different slopes are used in this modified linear waveform, waveforms having more than three different slopes may be used.

Figure 9:
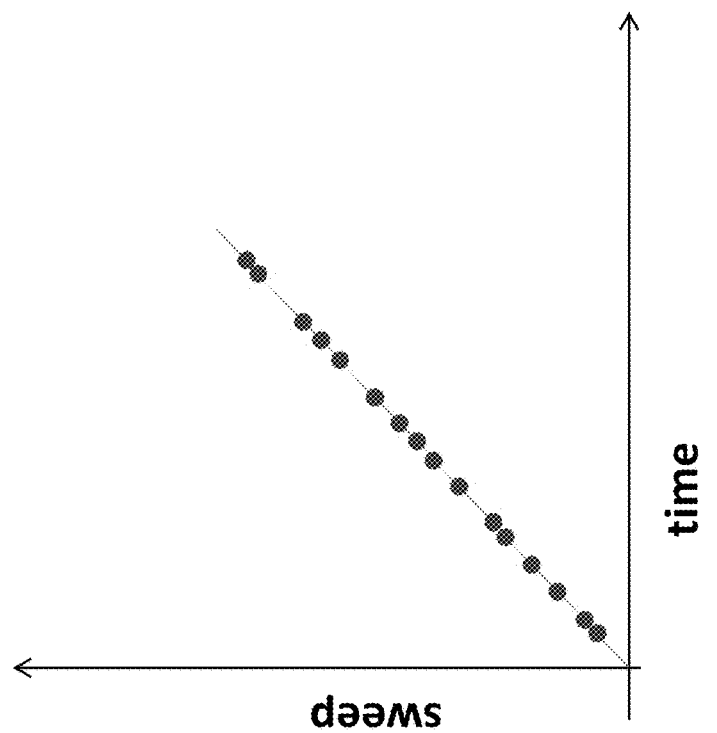
FIG. 9 shows a linear wavelength (frequency) sweep where the time spacing between steps is chosen to be random.
Figure 8:
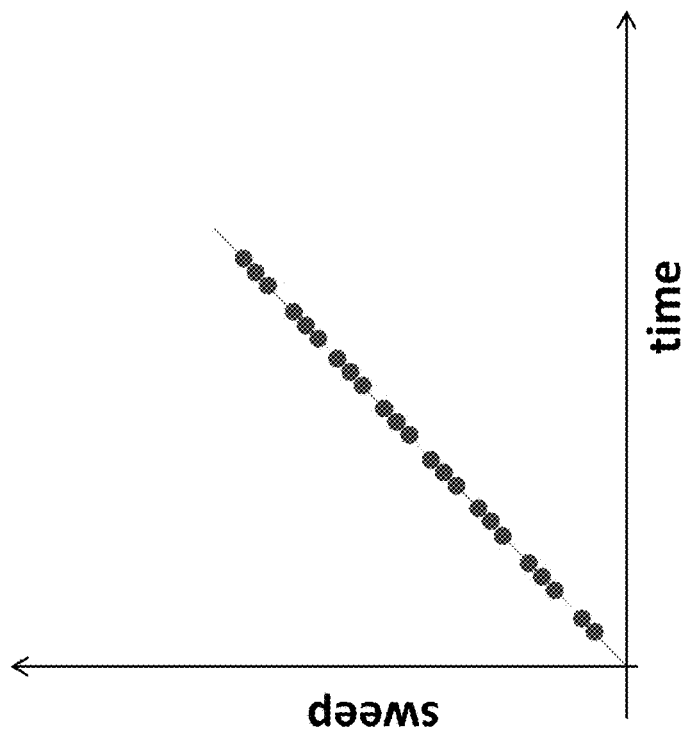
FIG. 8 is a plot of an exemplary linear wavelength (frequency) sweep using bursts of time sequenced steps separated by gaps in time where there is optionally no output.

FIG. 8 is a plot of an exemplary linear wavelength (frequency) sweep using bursts of time sequenced steps, separated by gaps in time where there is optionally no output. FIG. 9 shows a linear wavelength (frequency) sweep where the time spacing between steps is chosen to be random. The sweeps shown in FIGS. 8 and 9 are examples where alternative sampling techniques may be beneficial in the analysis of waveforms.

Figure 10:
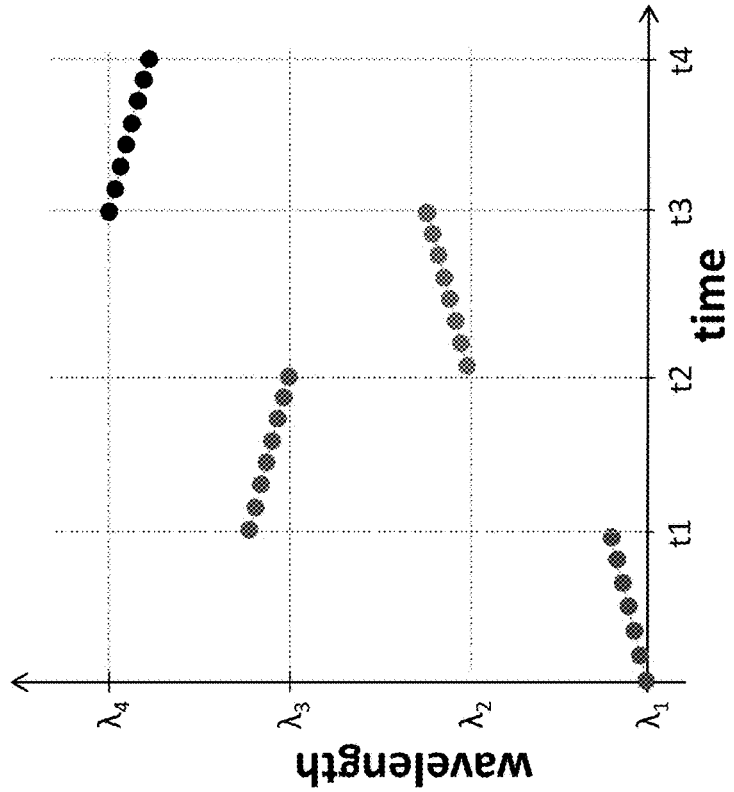
FIG. 10 shows a modified linear wavelength sweep waveform with multiple sub-paths.

FIGS. 10-13 are variations of a Stepped Chirped Frequency Waveform. FIG. 10 shows a modified linear wavelength sweep waveform with multiple sub-paths. In the sweep, there are linear portions (sub-paths) having an upward slope and linear portions (sub-paths) having a downward slope. The upward and downward portions include different wavelengths and there is a wavelength hop between the upward and downward portions.

Figure 11:
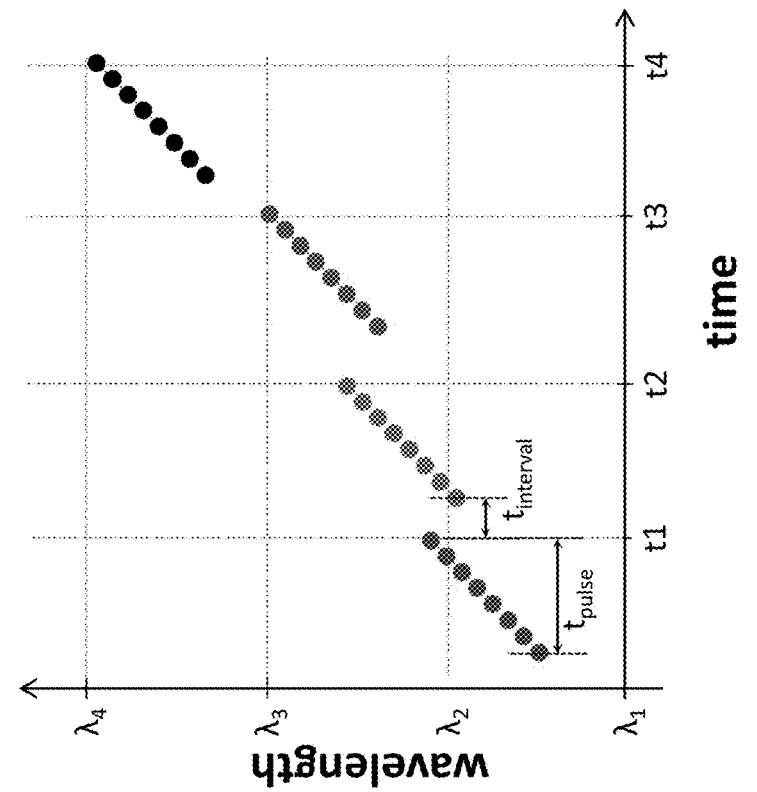
FIGS. 11 and 12 are additional modified linear wavelength sweep waveforms.
Figure 12:
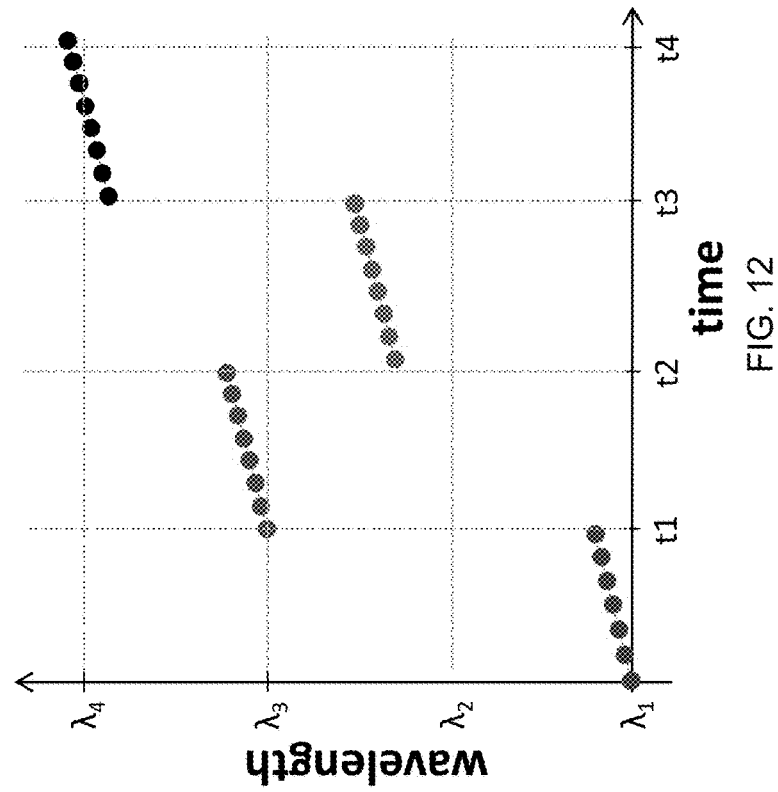

In FIG. 11, wavelength sweeping (frequency chirping) occurs for time $t_{pulse}$, then a delay time of $t_{interval}$ occurs, then a new wavelength sweep (frequency chirp) begins after a wavelength hop. This sequence can be repeated in a variety of ways to form a larger sweep pattern. FIG. 12 (like FIG. 11) includes wavelength sweeping (frequency chirping), but the wavelength hops between sweeps are chosen such that the entire waveform does not increase in wavelength as in FIG. 11. For example, the wavelength hops between sweep may be chosen as random values and be non-monotonic.

Figure 13:
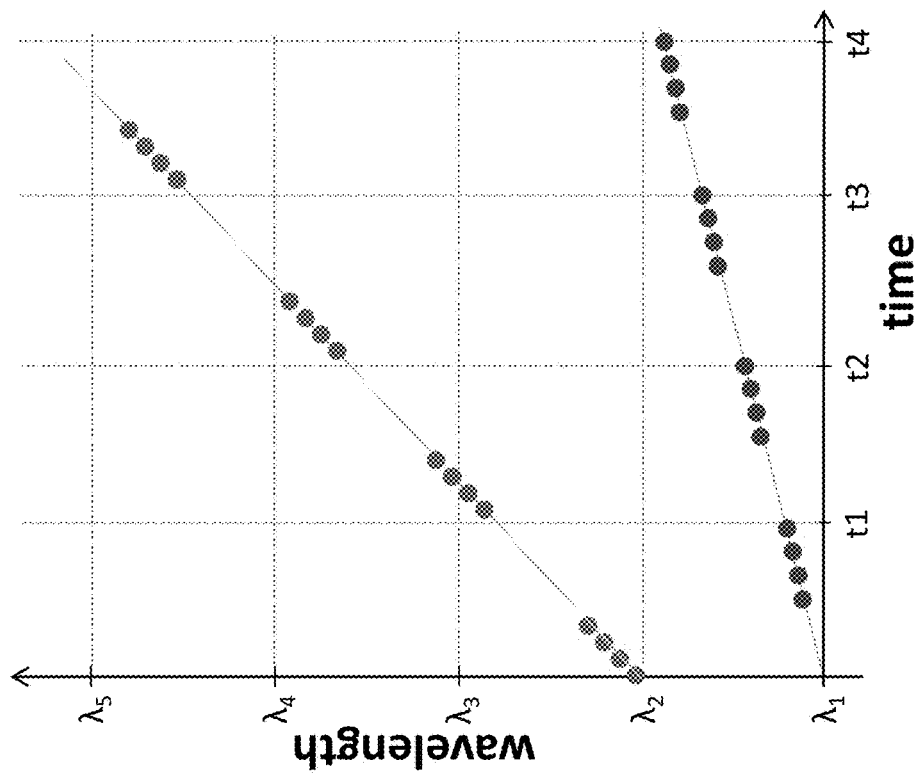
FIG. 13 shows a waveform including two multiplexed sweeps.

In FIG. 13, the pattern of hops and sweeps is chosen so that an entirely different wavelength pattern for a second sweep is positioned in the dwell times for a first sweep. That is, a first monotonically increasing sweep begins at $\lambda_2$. In the time when wavelengths are not being output for this first sweep, a second monotonically increasing sweep is output beginning at $\lambda_1$. In this way, the waveform of FIG. 13 takes advantage of the dead time (i.e., the time when no wavelengths are being output for the first sweep) to double the data rate and output a second sweep (multiplex two sweeps).

Figure 15:
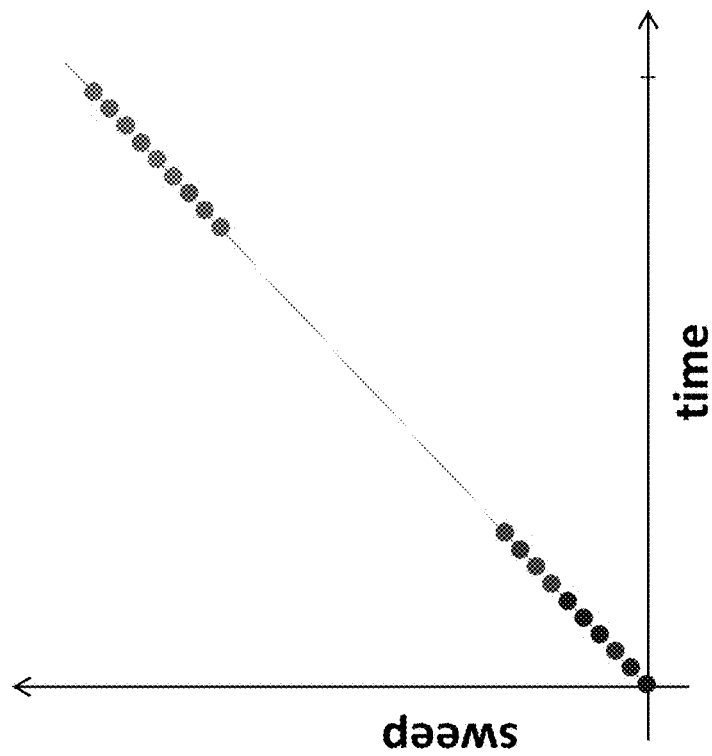
FIGS. 14 and 15 show a modified linear waveform where wavelength hops in the otherwise linear wavelength sweep are chosen so that sweeping occurs only across desired regions of interest.
Figure 14:
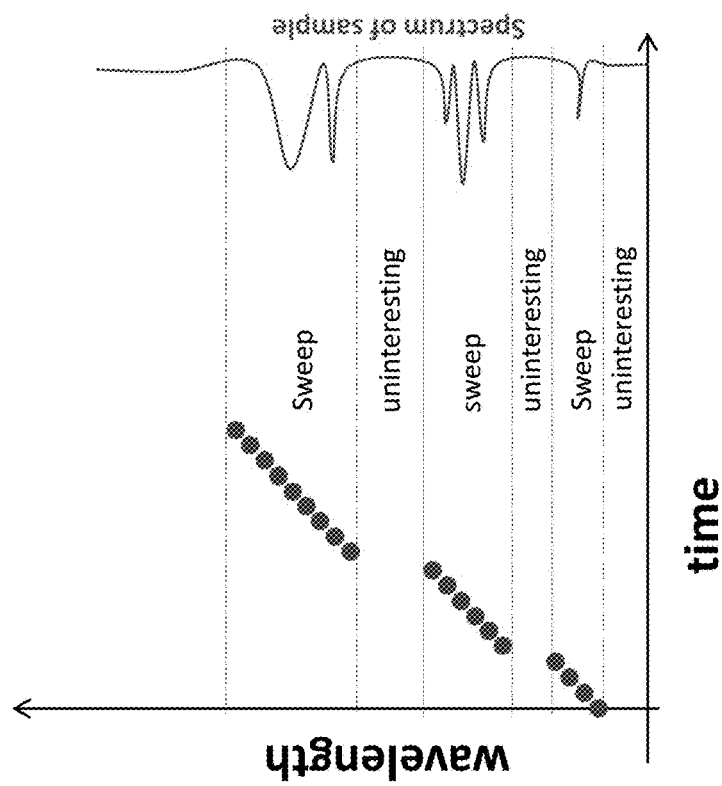

FIGS. 14 and 15 show modified linear waveforms where wavelength hops in the otherwise linear wavelength sweep are chosen so that sweeping occurs only across desired regions of interest, such as for spectroscopy as shown. In FIG. 14, by eliminating the time required to sweep across irrelevant or uninteresting portions of a larger sweep, the important data can be acquired faster and the total sweep time is reduced. In FIG. 15, there is a substantial and desired time gap between two sections of an overall linear sweep, but the sweep is otherwise contiguous. This gap may be chosen to coincide with wavelengths that do not produce relevant data for a particular application.

Figure 17:
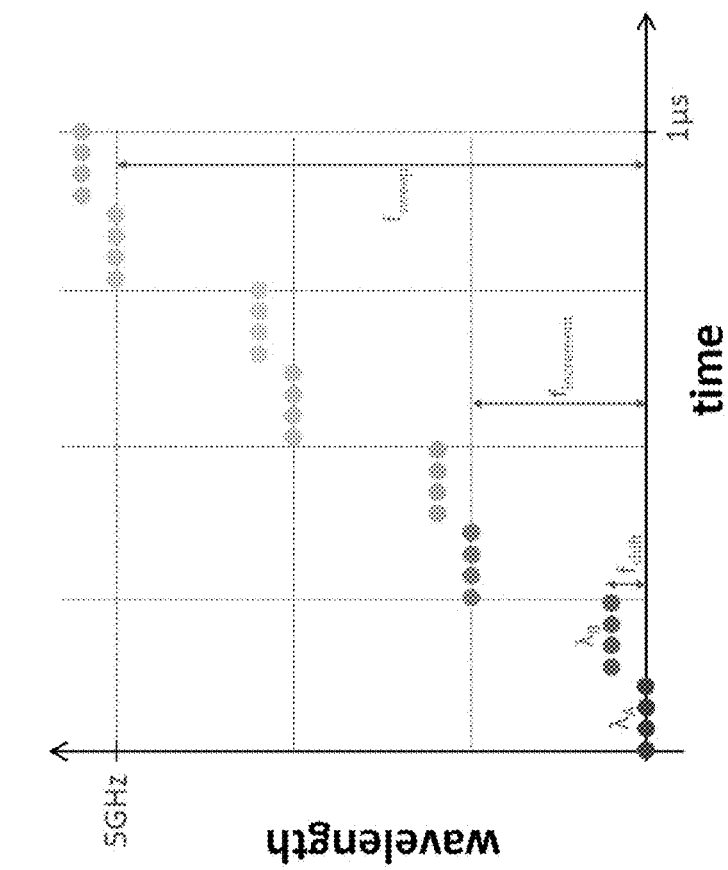
FIGS. 16 and 17 are exemplary Stepped Frequency Waveforms with linear monotonic changes in the wavelength steps.
Figure 16:
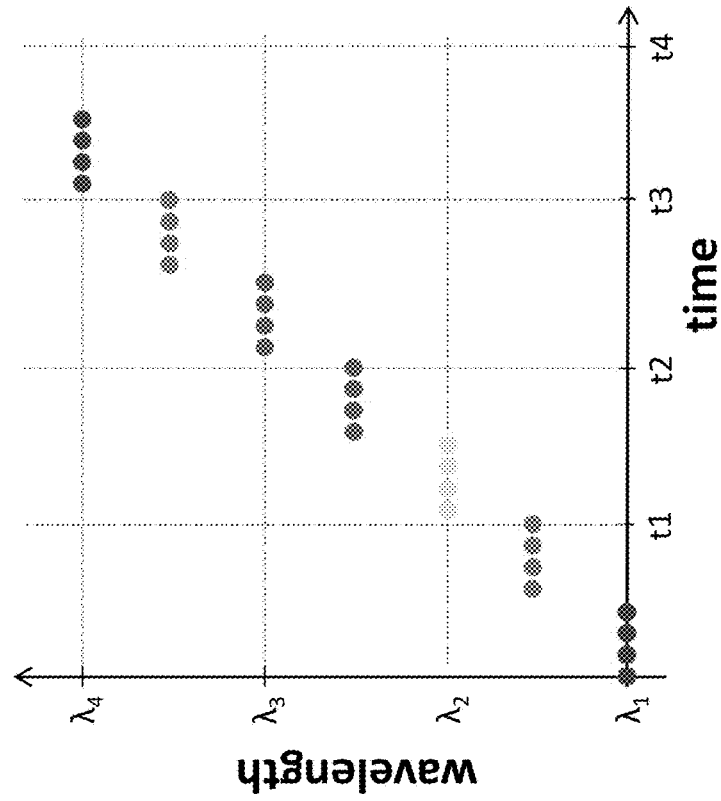

FIGS. 16 and 17 are exemplary Stepped Frequency Waveforms, with linear monotonic changes in the wavelength steps, covering a total bandwidth larger than the individual steps. While FIG. 16 includes singular steps, FIG. 17 includes pairs of steps (with corresponding pairs of hops). FIG. 17 has the benefit of helping to discriminate between targets and provide velocity information in LiDAR.

Figure 18:
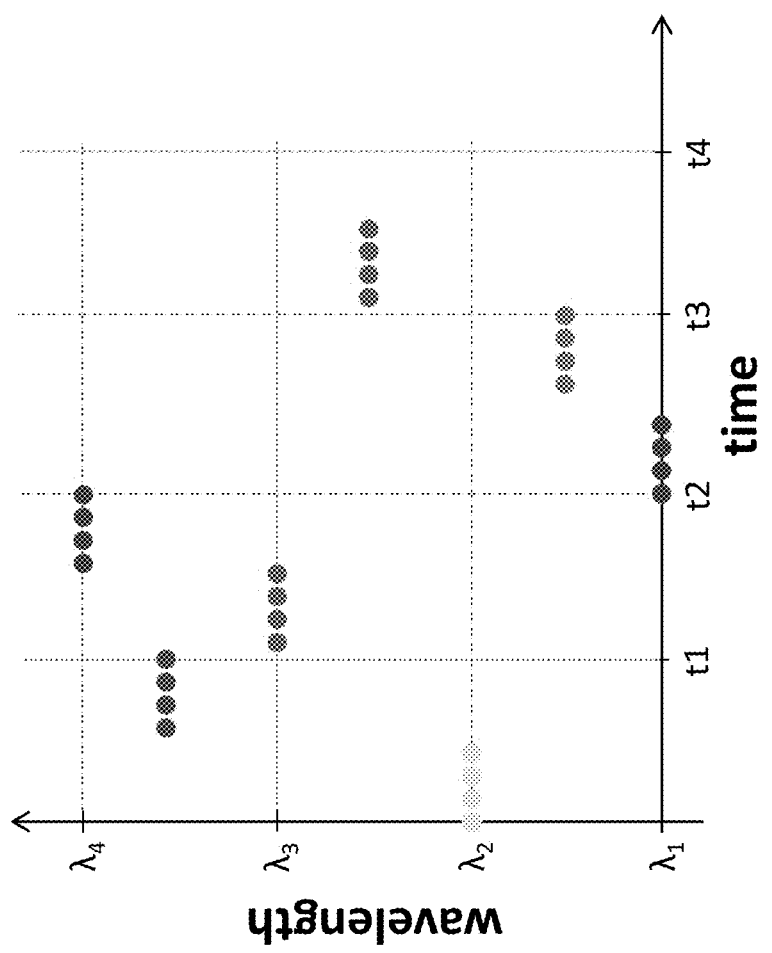
FIG. 18 is an example of a Stepped Frequency Waveform where the wavelength steps are random, but cover the same total bandwidth as a stepped linear monotonic waveform.

FIG. 18 is an example of a Stepped Frequency Waveform, where the wavelength steps are random but cover the same total bandwidth as a stepped linear monotonic waveform. This example is often referred to as a Costas Code waveform.

Figure 20:
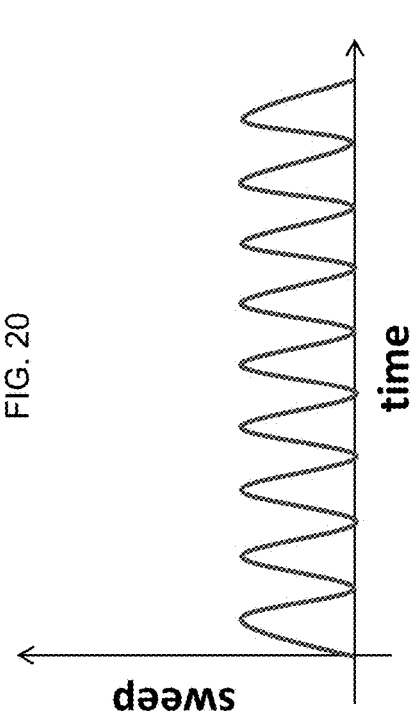
FIG. 20 shows a higher resolution view of sinusoidal wavelength modulation.
Figure 19:
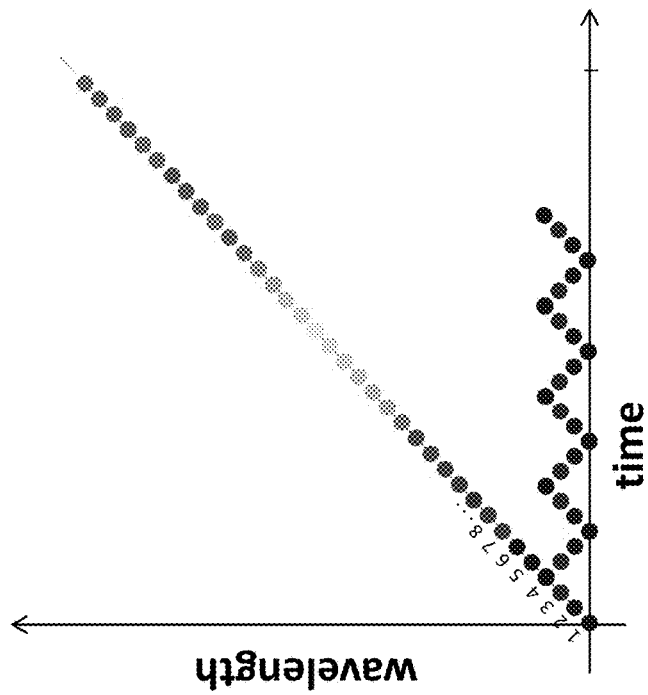
FIG. 19 shows a linear sweep as well as a sweep corresponding to wavelength modulation.

FIG. 19 shows a linear sweep as well as a sweep corresponding to wavelength modulation (show as a sawtooth). As shown, a normal linear sweep is sequential: e.g., 1→2→3→4→5→6→7→8→. Wavelength modulation is different: e.g., 1→2→3→4→3→2→1→2→3→4→. The wavelength modulation in FIG. 19 is 'low resolution' compared to the higher resolution view of sinusoidal wavelength modulation shown in FIG. 20.

Figure 21:
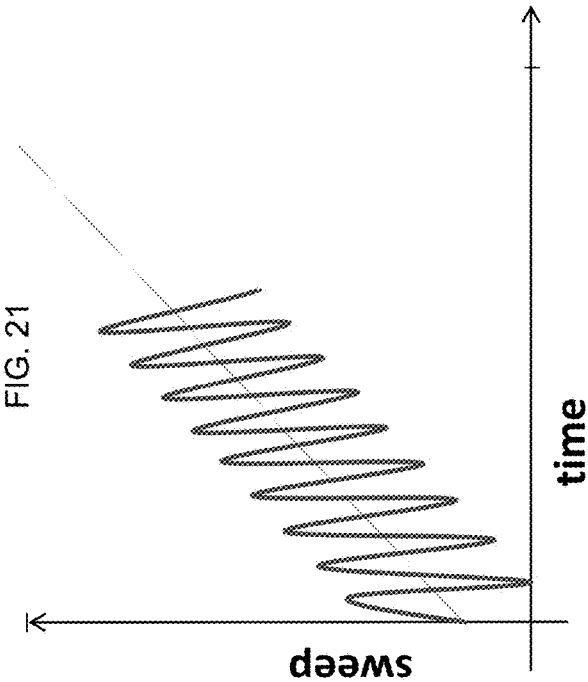
FIG. 21 shows the sequence for a combined wavelength sweep with wavelength modulation.

FIG. 21 shows the sequence, or stepping pattern, for a combined wavelength sweep with wavelength modulation. Such a sweep is not sequential: e.g., 1→2→3→4→3→2→3→4→5→4→3→4→5→6→5→4→5→6→7→etc.

Figure 22:
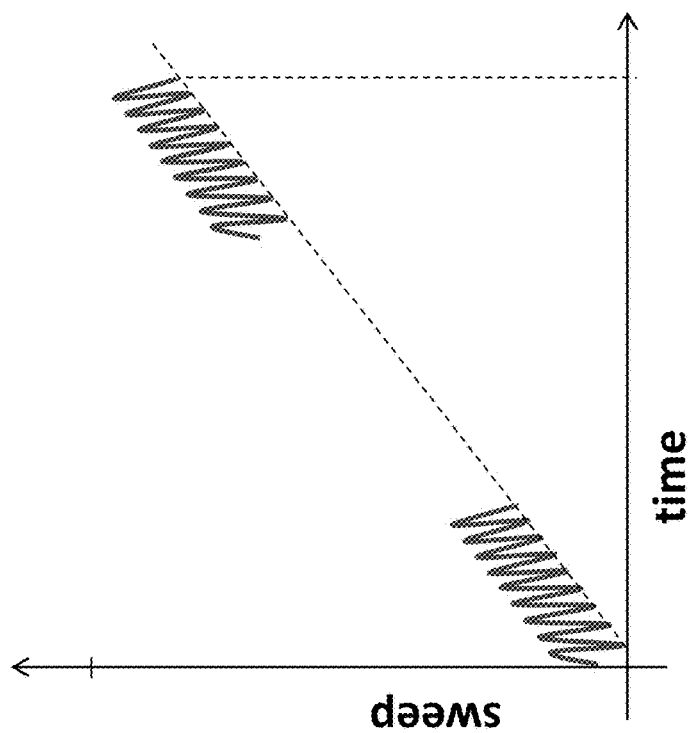
FIG. 22 shows an overall sweep containing a time gap between linear sweep segments and also containing wavelength modulation.

FIG. 22 represents another combination of possible sweeps, where an overall sweep contains a time gap between linear sweep segments, and also each linear sweep segment contains wavelength modulation. Further encoding is possible by choosing the modulation frequency to be different for the two segments of the sweep. Wavelength modulation allows for encoding and reducing interference (e.g., improving signal-to-noise ratio).

Figure 23:
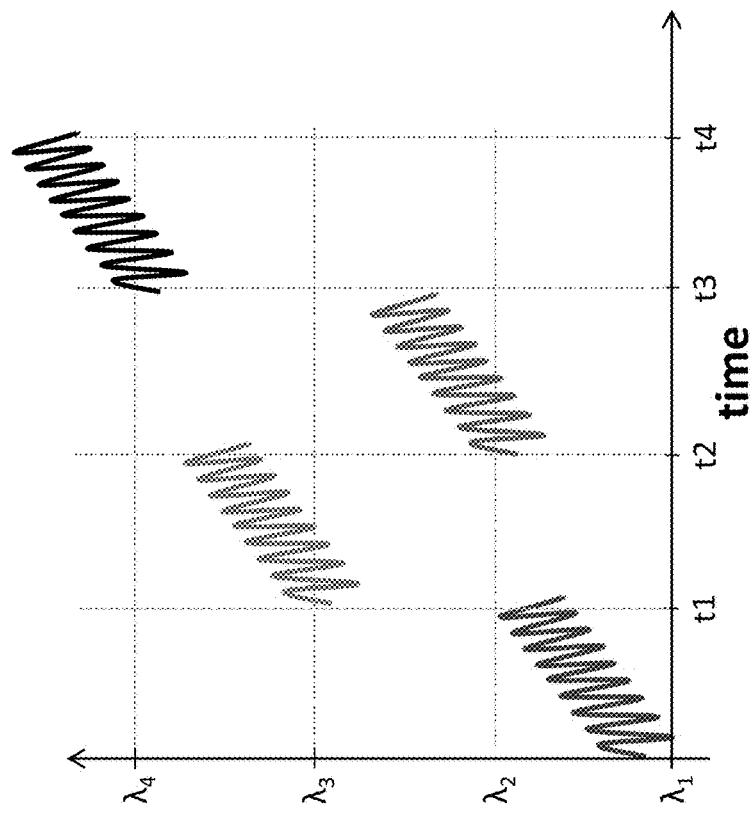
FIG. 23 shows a combination of sweeps having randomized wavelength jumps between linear sweep segments and also containing wavelength modulation.

FIG. 23 shows another combination of possible sweeps, where there are randomized wavelength jumps between linear sweep segments, and each segment also contains wavelength modulation.

Figure 24:
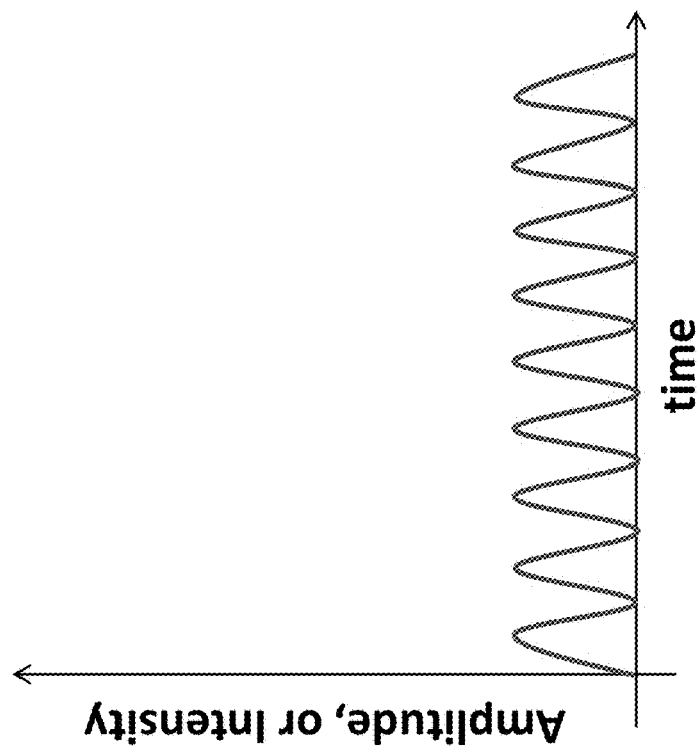
FIG. 24 shows a sinusoidal modulation of amplitude.

FIG. 24 shows a sinusoidal modulation of amplitude (distinguished from wavelength modulation). Amplitude modulation (or AM) can be used alone, or in any combination with the other waveforms described herein.

Figure 25:
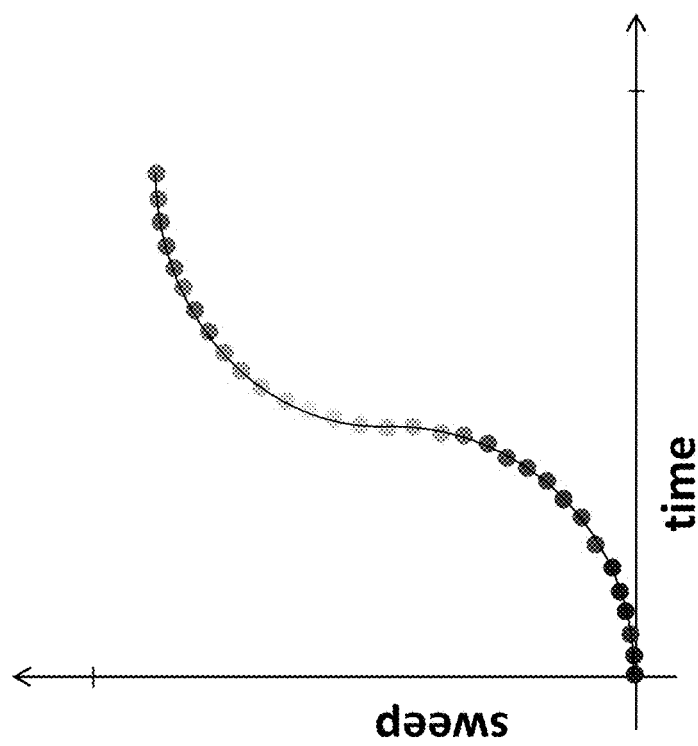
FIG. 25 shows a wavelength sweep, where the path deviates from linearity.

FIG. 25 shows a wavelength sweep, where the path deviates substantially from linearity. Such a sweep could have an exponential, polynomial, sigmoidal, or any other functional form.

Although the invention is shown and described with respect to illustrative embodiments, it is evident that equivalents and modifications will occur to those persons skilled in the art upon the reading and understanding hereof. The present invention includes all such equivalents and modifications and is limited only by the scope of the claims if appended hereto.

What is claimed is:

1. A method for controlling an electromagnetic radiation source to produce a single mode operation having an optimized side-mode suppression ratio over a set of wavelengths within a prescribed temporal profile, the electromagnetic radiation source configured to output electromagnetic radiation at a given wavelength based upon parameters and an optical system configured to measure wavelength and side-mode suppression ratio, the method comprising:
    determining a set of parameter combinations that satisfy a condition for a desired set of wavelengths, wherein the parameters define a multivariate space, each parameter combination comprising a point in the multivariate space, the set of parameter combinations define sub-paths for transitioning from one wavelength to another wavelength, and combinations of select sub-paths provide a multivariate path for transitioning over the range of wavelengths;
    controlling the electromagnetic radiation source to emit electromagnetic radiation over the range of wavelengths by traversing the multivariate path in a desired manner, wherein the desired manner is a prescribed time sequence of wavelengths, and the electromagnetic radiation source outputs the electromagnetic radiation;
    generating the multivariate space comprising:
        supplying parameter combinations to the electromagnetic radiation source;
        measuring the wavelength, the side mode suppression ratio, and the optical power of the output for the electromagnetic radiation source using the optical system; and
        incorporating the measured wavelength and the measured side mode suppression ratio into the multivariate space at the point in the multivariate space designated by the parameter combination; and
    wherein the electromagnetic radiation emitted by the electromagnetic radiation source has a set of optical output powers over a prescribed temporal profile.

2. The method of claim 1, wherein the multivariate path comprises a discontinuous path through the multivariate space.

3. The method of claim 2, wherein the multivariate path comprises at least one of steps, hops, gaps, nonlinear variation, continuous sweeps, or a random sequence of wavelengths.

4. The method of claim 3, wherein the time between steps, hops, gaps, nonlinear variation, continuous sweep, or random sequence of wavelengths is less than 1-10 nanoseconds.

5. The method of claim 1, wherein the wavelength and the side-mode suppression ratio are determined for a parameter combination by measuring the electromagnetic radiation source output for the parameter combination.

6. The method of claim 5, wherein the wavelength and the side-mode suppression ratio for a previously unmeasured parameter combination is measured for parameter combinations that are identified as sub-paths to the multivariate path.

7. The method of claim 6, wherein the previously unmeasured parameter combinations are measured in order to find sub-paths to connect unconnected selected sub-paths.

8. The method of claim 1, wherein the sub-paths of the multivariate path are selected based on an average of the side mode suppression ratio for the sub-path, a maximum of the side mode suppression ratio for the sub-path, or a combination thereof.

9. The method of claim 1, wherein the parameters include front mirror current, back mirror current, phase current, gain, semiconductor optical amplifier current, temperature, indices of refraction, pressures, positions of cavity mirrors, external optical feedback, or a combination thereof.

10. The method of claim 1, wherein:
    the electromagnetic source is a semiconductor light source or a monolithic light source; and
    the multivariate space consists of:
        one control current or one voltage; and
        the temperature of the semiconductor light source.

11. The method of claim 1, wherein each sub-path must satisfy the condition for a range of wavelengths larger than a range threshold to be selected for combination into the multivariate path.

12. The method of claim 1, further comprising generating the multivariate space for a supplied list of parameter combinations, wherein the multivariate space is generated by determining the wavelength and side mode suppression ratio for each parameter combination in the list by measuring the electromagnetic radiation source output corresponding to the parameter combination.

13. The method of claim 12, wherein the list of parameter combinations is a default list or supplied by a user.

14. The method of claim 12, wherein:
    the electromagnetic radiation source includes an optical system; and
    when generating the multivariate space:
        the wavelength and the side mode suppression ratio for each parameter combination are determined by measuring the output of the electromagnetic radiation source using the optical system; and the measured wavelength and the measured side mode suppression ratio are incorporated into the multivariate space at the point in the multivariate space designated by the parameter combination.

15. The method of claim 14, wherein when a supplied parameter combination of the supplied list of parameter combinations are already incorporated into the multivariate space, the multivariate space is updated to account for the measured wavelength and the measured side-mode suppression ratio.

16. The method of claim 14, wherein the generation of the multivariate space is performed at least one of:

when the wavelength and the side-mode suppression ratio for a particular supplied parameter combination has not been measured for a given duration of time;

a user requests generation of the multivariate space;

when an ambient temperature at which the wavelength and the side-mode suppression ratio for a given parameter combinations was measured changes by at least a predetermined amount; or when a specified set of parameter combinations does not satisfy the condition for the desired set of wavelengths within a desired tolerance.

17. The method of claim 16, wherein the given duration of time is 24 hours, the predetermined amount of temperature change is five degrees Celsius, and the desired tolerance is 1% or 3%.

18. The method of claim 16, wherein the condition is side-mode suppression ratio and/or the time sequence of wavelengths emitted by the electromagnetic radiation source.

19. The method of claim 14, wherein:

the generating of the multivariate space is performed at least one of:

by measuring with the optical system the emitted electromagnetic radiation over the range of wavelengths when traversing the multivariate path in the desired manner;

during a time duration when the electromagnetic radiation source is not outputting electromagnetic radiation, by closing a shutter of the electromagnetic radiation source such that electromagnetic radiation is not externally emitted by the electromagnetic radiation source and supplying the parameter combination to the electromagnetic radiation source and measuring with the optical system the wavelength and the side-mode suppression ratio of the electromagnetic radiation generated by the electromagnetic radiation source based on the supplied parameter combination.

20. The method of claim 1, wherein the prescribed wavelength temporal profile ends in less than 1 to 10 microseconds and includes changes in the wavelength within the profile that occur in less than 10 nanoseconds.

21. A system for controlling an electromagnetic radiation source to produce a single mode operation having an optimized side-mode suppression ratio over a set of wavelengths within a prescribed temporal profile, the system comprising:

the electromagnetic radiation source configured to output electromagnetic radiation over a range of wavelengths, wherein the radiation source outputs electromagnetic radiation at a wavelength based upon parameters;

a controller coupled to the electromagnetic radiation source, wherein the controller is adapted to:

supply parameters to the electromagnetic radiation source;

determine a set of parameter combinations that satisfy a condition for a desired set of wavelengths in the range of wavelengths, wherein the parameters define a multivariate space, each parameter combination comprising a point in the multivariate space, the set of parameter combinations define sub-paths for transitioning from one wavelength to another wavelength, and combinations of select sub-paths provide a multivariate path for transitioning over the range of wavelengths; and control the electromagnetic radiation source to emit electromagnetic radiation over the range of wavelengths by traversing the multivariate path in a desired manner, wherein the desired manner is a prescribed time sequence of wavelengths, and the electromagnetic radiation source outputs the electromagnetic radiation; and an optical system, wherein the controller is further adapted to generate the multivariate space comprising:

supplying parameter combinations to the electromagnetic radiation source;

measuring the wavelength, side mode suppression ratio, and optical power of the output for electromagnetic radiation source using the optical system; and incorporating the measured wavelength and the measured side mode suppression ratio into the multivariate space at the point in the multivariate space designated by the parameter combination; and wherein the electromagnetic radiation emitted by the electromagnetic radiation source has a set of optical output powers over a prescribed temporal profile.

22. The system of claim 21, wherein a portion of the parameters are not supplied by the controller.

23. The system of claim 22, wherein parameters corresponding to environmental factors are not supplied by the controller and are compensated for by the supplied parameters.

24. The system of claim 21, wherein the electromagnetic radiation source is at least one of a semiconductor laser, a monolithic laser, a coupled-cavity semiconductor laser, a discrete mode semiconductor laser, a semiconductor ring laser, a sampled grating distributed Bragg reflector (SG-DBR) laser, a MEMS-tunable semiconductor laser, a semiconductor laser coupled to and tunable by a cavity external to the laser, or a monolithic combination of laser and external optics.

25. The system of claim 21, further comprising an optical system, wherein the optical system is adapted to measure properties of the electromagnetic radiation source output, including at least one of the wavelength, optical power, and side mode suppression ratio.

26. The system of claim 21, further comprising an electronic system adapted to measure the parameters at the electromagnetic radiation source.

27. The system of claim 26, wherein temperature and humidity are parameters measured by the electronic system.

* * * * *